(12) United States Patent
Kanegae et al.

(10) Patent No.: US 8,796,692 B2
(45) Date of Patent: Aug. 5, 2014

(54) THIN-FILM SEMICONDUCTOR DEVICE AND METHOD FOR FABRICATING THIN-FILM SEMICONDUCTOR DEVICE

(71) Applicant: Panasonic Corporation, Osaka (JP)

(72) Inventors: Arinobu Kanegae, Osaka (JP); Takahiro Kawashima, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/997,802

(22) PCT Filed: Oct. 23, 2012

(86) PCT No.: PCT/JP2012/006771
§ 371 (c)(1),
(2), (4) Date: Jun. 25, 2013

(87) PCT Pub. No.: WO2013/061574
PCT Pub. Date: May 2, 2013

(65) Prior Publication Data
US 2014/0054590 A1    Feb. 27, 2014

(30) Foreign Application Priority Data

Oct. 28, 2011    (JP) .................... 2011-236725

(51) Int. Cl.
*H01L 29/786*    (2006.01)
*H01L 21/336*    (2006.01)
*H01L 29/66*    (2006.01)
*H01L 27/32*    (2006.01)

(52) U.S. Cl.
CPC .......... *H01L 29/786* (2013.01); *H01L 29/6675* (2013.01); *H01L 29/78696* (2013.01); *H01L 29/66765* (2013.01); *H01L 29/78618* (2013.01); *H01L 27/3262* (2013.01)
USPC .............. 257/72; 257/E21.414; 257/E29.294; 438/160

(58) Field of Classification Search
USPC ............................ 257/72, E29.294, E27.414; 438/158–160
See application file for complete search history.

(56) References Cited

U.S. PATENT DOCUMENTS 6,855,954 B1 *    2/2005    Zhang .............................. 257/59
7,768,009 B2    8/2010    Kobayashi et al.
(Continued)

FOREIGN PATENT DOCUMENTS

JP    64-004071    1/1989
JP    09-008311    1/1997
(Continued)

OTHER PUBLICATIONS

International Search Report (ISR) and Written Opinion in International Application No. PCT/JP2012/006771, dated Nov. 20, 2012.

*Primary Examiner* — Daniel Shook
(74) *Attorney, Agent, or Firm* — Greenblum & Bernstein, P.L.C.

(57) ABSTRACT

A thin-film semiconductor device includes: a gate electrode; a channel layer; a first amorphous semiconductor layer; a channel protective layer; a pair of second amorphous semiconductor layers formed on side surfaces of the channel layer; and a pair of contact layers which contacts the side surfaces of the channel layer via the second amorphous semiconductor layers. The gate electrode, the channel layer, the first amorphous semiconductor layer, and the channel protective layer are stacked so as to have outlines that coincide with one another in a top view. The first amorphous semiconductor layer has a density of localized states higher than those of the second amorphous semiconductor layers. The second amorphous semiconductor layers have band gaps larger than that of the first amorphous semiconductor layer.

8 Claims, 11 Drawing Sheets

(56) References Cited

U.S. PATENT DOCUMENTS

| | | |
|---|---|---|
| 8,022,405 B2 | 9/2011 | Yamazaki |
| 8,133,771 B2 | 3/2012 | Kobayashi et al. |
| 8,377,723 B2 | 2/2013 | Nagai et al. |
| 8,389,993 B2 | 3/2013 | Kobayashi et al. |
| 2009/0020759 A1* | 1/2009 | Yamazaki ............ 257/59 |
| 2009/0057672 A1 | 3/2009 | Kobayashi et al. |
| 2010/0285624 A1 | 11/2010 | Kobayashi et al. |
| 2011/0227132 A1 | 9/2011 | Anda et al. |
| 2011/0250726 A1 | 10/2011 | Murayama et al. |
| 2011/0278577 A1 | 11/2011 | Yamazaki |
| 2012/0129288 A1 | 5/2012 | Kobayashi et al. |
| 2013/0001559 A1 | 1/2013 | Kishida et al. |
| 2013/0082297 A1 | 4/2013 | Noguchi et al. |

FOREIGN PATENT DOCUMENTS

| | | |
|---|---|---|
| JP | 10-270701 | 10/1998 |
| JP | 2001-119029 | 4/2001 |
| JP | 2009-049384 | 3/2009 |
| JP | 2009-076894 | 4/2009 |
| JP | 2010-287634 | 12/2010 |

* cited by examiner

THIN-FILM SEMICONDUCTOR DEVICE AND METHOD FOR FABRICATING THIN-FILM SEMICONDUCTOR DEVICE

TECHNICAL FIELD

The present invention relates to thin-film semiconductor devices, and in particular to a thin-film semiconductor device used for pixel circuits in a display device.

BACKGROUND ART

In recent years, organic EL displays using electroluminescence (EL) of an organic material have been attracting attention as a type of next-generation flat panel display replacing liquid crystal displays.

Unlike the voltage-driven liquid crystal display, the organic EL display is a current-driven display device. Accordingly, there is an urgent need for development of a thin-film transistor (TFT) having excellent characteristics as a driving circuit for the active-matrix display device. The TFT is used as a switching device for selecting a pixel or a driving transistor for driving the pixel.

A description is given of a configuration of a conventional thin-film semiconductor device (a thin-film transistor), with reference to FIG. 7 (for example, see Patent Literatures (PLT) 1 and 2). A thin-film semiconductor device 900 shown in FIG. 7 includes: a substrate 910; a gate electrode 920; a gate insulating film 930; a crystalline silicon layer 940; a non-crystalline silicon layer 950; a channel protective layer 960; a pair of contact layers 971 and 972; a source electrode 981; and a drain electrode 982. The thin-film semiconductor device 900 is a bottom-gate thin-film transistor formed by stacking these elements in the mentioned order.

In the thin-film semiconductor device 900 with such a configuration, positive fixed charge exists in the channel protective layer 960. Hence, a back channel is formed in the crystalline silicon layer 940 which includes a channel region, due to the fixed charge. As a result, leakage current occurs, degrading the off-characteristics. Here, the back channel refers to a pathway of parasitic current which flows from the source electrode 981 to the drain electrode 982 via the vicinity of the interface, within the crystalline silicon layer 940, between the crystalline silicon layer 940 and the channel protective layer 960.

In view of this, the non-crystalline silicon layer 950 made of an amorphous silicon film is formed between the crystalline silicon layer 940 and the channel protective layer 960. The non-crystalline silicon layer 950 can shield the electric field by cancelling positive fixed charge in the channel protective layer 960 by the charge density of the negative carriers. With this, it is possible to suppress formation of a back channel, suppressing leakage current when the thin-film semiconductor device 900 is turned off. Accordingly, the off-characteristics can be improved.

CITATION LIST

Patent Literature

[PTL 1] Japanese Unexamined Patent Application Publication No. 2001-119029

[PTL 2] Japanese Unexamined Patent Application Publication No. 64-004071

SUMMARY OF INVENTION

Technical Problem

However, in the conventional thin-film semiconductor device, it is difficult to concurrently improve the off-characteristics by suppressing leakage current when the thin-film semiconductor device is turned off and to decrease the on-resistance.

The present invention has been conceived in view of the above problem, and has an object to provide a thin-film semiconductor device in which the off-characteristics are improved by suppressing the leakage current when the thin-film semiconductor device is turned off and the on-resistance is decreased.

Solution to Problem

The thin-film semiconductor device according to an aspect of the present invention includes: a substrate; a gate electrode above the substrate; a gate insulating film above the gate electrode; a channel layer above the gate insulating film, the channel layer comprising a polycrystalline semiconductor; a first amorphous semiconductor layer above the channel layer; an organic insulating layer above the first amorphous semiconductor layer; a pair of second amorphous semiconductor layers, one of which is positioned at a side surface on one side of the first amorphous semiconductor layer and a side surface on one side of the channel layer, and the other of which is positioned at a side surface on the other side of the first amorphous semiconductor layer and a side surface on the other side of the channel layer; a pair of contact layers above the pair of second amorphous semiconductor layers, the pair of contact layers contacting the side surfaces of the channel layer via the pair of second amorphous semiconductor layers; a source electrode above one of the pair of contact layers; and a drain electrode above the other of the pair of contact layers. In the thin-film semiconductor device; the gate electrode, the channel layer, the first amorphous semiconductor layer, and the organic insulating layer have outlines that coincide with one another in a top view, the first amorphous semiconductor layer has a density of localized states higher than a density of localized states of the pair of second amorphous semiconductor layers, and the pair of second amorphous semiconductor layers has a band gap larger than a band gap of the first amorphous semiconductor layer.

Advantageous Effects of Invention

According to the present invention, it is possible to achieve a thin-film semiconductor device in which the off-characteristics are improved by suppressing leakage current when the thin-film semiconductor device is turned off and the on-resistance is decreased.

DESCRIPTION OF EMBODIMENTS

How the Present Disclosure was Achieved

Figure 7:
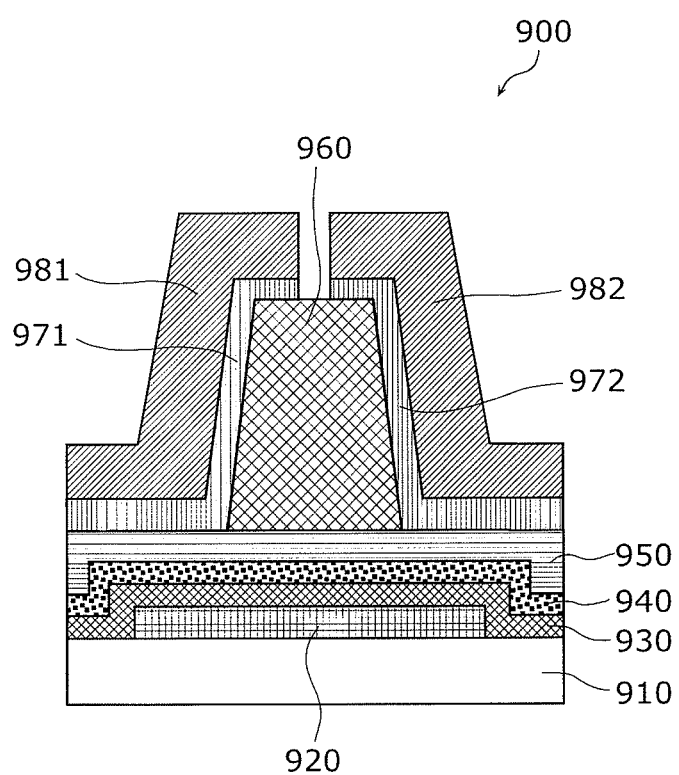
FIG. 7 is a cross-sectional view illustrating a configuration of a conventional thin-film semiconductor device.

In a conventional thin-film semiconductor device 900 illustrated in FIG. 7, when an organic material is used for a channel protective layer 960, a non-crystalline silicon layer 950 needs to have a high density of localized states and a large band gap. However, it is extremely difficult for the non-crystalline silicon layer 950 made of a single layer to have such properties.

Furthermore, in the thin-film semiconductor device 900 with the above configuration, the non-crystalline silicon layer 950 is present between the crystalline silicon layer 940 which includes a channel region and the source electrode 981 and between the crystalline silicon layer 940 and the drain electrode 982. Consequently, the high-resistance non-crystalline silicon layer 950 is included in a current path, resulting in an increase in the on-resistance.

The present invention has an object to provide a thin-film semiconductor device in which the off-characteristics are improved by suppressing the leakage current when the thin-film semiconductor device is turned off and to decrease the on-resistance.

In order to achieve the object, the thin-film semiconductor device according to an aspect of the present invention includes: a substrate; a gate electrode above the substrate; a gate insulating film above the gate electrode; a channel layer above the gate insulating film, the channel layer comprising a polycrystalline semiconductor; a first amorphous semiconductor layer above the channel layer; an organic insulating layer above the first amorphous semiconductor layer; a pair of second amorphous semiconductor layers, one of which is positioned at a side surface on one side of the first amorphous semiconductor layer and a side surface on one side of the channel layer, and the other of which is positioned at a side surface on the other side of the first amorphous semiconductor layer and a side surface on the other side of the channel layer; a pair of contact layers above the pair of second amorphous semiconductor layers, the pair of contact layers contacting the side surfaces of the channel layer via the pair of second amorphous semiconductor layers; a source electrode above one of the pair of contact layers; and a drain electrode above the other of the pair of contact layers. In the thin-film semiconductor device, the gate electrode, the channel layer, the first amorphous semiconductor layer, and the organic insulating layer have outlines that coincide with one another in a top view, the first amorphous semiconductor layer has a density of localized states higher than a density of localized states of the pair of second amorphous semiconductor layers, and the pair of second amorphous semiconductor layers has a band gap larger than a band gap of the first amorphous semiconductor layer.

With the above configuration, the gate electrode does not overlap the source electrode and the drain electrode in regions on the left and right of the channel protective layer. Accordingly, parasitic capacitance in the regions can be decreased. Furthermore, the contact layers are in contact with side surfaces of the channel layer via the second amorphous semiconductor layer. Accordingly, the high-resistance first amorphous semiconductor layer can be excluded from a current path, allowing a decrease in the on-resistance. Furthermore, by providing a first amorphous semiconductor layer having a higher density of localized states and a second amorphous semiconductor layer having a larger band gap, it is possible to significantly increase performance of the thin-film semiconductor device.

Furthermore, in the thin-film semiconductor device, it may be that the outline on a lower surface of the organic insulating layer recedes inside the outline of the gate electrode by 0.5 μm at most, in a top view.

In this Specification, an error of approximately 0.5 μm in the fabrication process is included in a range of "outlines that coincide with one another".

Furthermore, in the thin-film semiconductor device, it may be that the outline on the lower surface of the organic insulating layer recedes inside the outline of the gate electrode by a value greater than or equal to a thickness of the pair of second amorphous semiconductor layers, in a top view.

With this, the second amorphous semiconductor layer is formed at a position overlapping the gate electrode. Accordingly, the on-resistance can be decreased.

Furthermore, in the thin-film semiconductor device, it may be that the pair of second amorphous semiconductor layers, the pair of contact layers, the source electrode, and the drain electrode extend to a part of an upper surface of the organic insulating layer and a side surface of the organic insulating layer.

Furthermore, in the thin-film semiconductor device, it may be that the first amorphous semiconductor layer has a thickness of 50 nm at most.

The first amorphous semiconductor layer has high absorptance of light used in an exposure process. Accordingly, excessive increase in thickness of the first amorphous semiconductor layer may prevent the organic insulating layer from receiving necessary amount of exposure, resulting in insufficient exposure of the organic insulating layer. There is also another possibility that the exposure for a long time would be necessary to obtain necessary amount of exposure, which could result in significantly degraded productivity. If the amount of light used for the exposure process is increased, the thickness of the first amorphous semiconductor layer may be greater than or equal to 50 nm.

Furthermore, the method for fabricating a thin-film semiconductor device according to an aspect of the present invention includes: preparing a substrate; forming a gate electrode above the substrate; forming a gate insulating film above the gate electrode; forming a crystalline semiconductor layer above the gate insulating film; forming an amorphous semiconductor layer above the crystalline semiconductor layer; forming an organic insulating layer above the amorphous semiconductor layer; etching the crystalline semiconductor layer and the amorphous semiconductor layer to form a channel layer and a first amorphous semiconductor layer at positions overlapping the gate electrode; forming a pair of second amorphous semiconductor layers, one of which is formed at a side surface on one side of the first amorphous semiconductor layer and a side surface on one side of the channel layer, and the other of which is formed at a side surface on the other side of the first amorphous semiconductor layer and a side surface on the other side of the channel layer; forming a pair of contact layers above the pair of second amorphous semiconductor layers, the pair of contact layers contacting the side surfaces of the channel layer via the pair of second amorphous semiconductor layers; and forming a source electrode above one of the pair of contact layers, and forming a drain electrode above the other of the pair of contact layers. In the forming of an organic insulating layer, an outline on a lower surface of the organic insulating layer recedes inside an outline of the gate electrode in a top view by (i) applying an organic material serving as a precursor of the organic insulating layer onto the amorphous semiconductor layer and drying the organic material, (ii) exposing, using the gate electrode as a mask, the organic material to light emitted from a surface of the substrate opposite a surface of the substrate on which the gate electrode is formed, and (iii) developing the organic material.

Furthermore, in the method for fabricating a thin-film semiconductor device, it may be that in the etching of the crystalline semiconductor layer and the amorphous semiconductor layer, the developed organic insulating layer is used as a mask to allow the outline on the lower surface of the organic insulating layer to recede inside the outline of the gate electrode by a value greater than or equal to a thickness of the pair of second amorphous semiconductor layers, in a top view.

Furthermore, in the method for fabricating a thin-film semiconductor device, it may be that the first amorphous semiconductor layer is formed to have a density of localized states higher than a density of localized states of the pair of second amorphous semiconductor layers, and the pair of second amorphous semiconductor layers are formed to have a band gap larger than a band gap of the first amorphous semiconductor layer.

Embodiment

Hereinafter, descriptions are given of a thin-film semiconductor device and a method for fabricating the thin-film semiconductor device according to the present invention, with reference to the drawings. The embodiment described below shows a preferred specific example of the present invention. Accordingly, the numerical values, shapes, materials, structural elements, the arrangement and connection of the structural elements, steps, the processing order of the steps etc. shown in the following embodiment are mere examples, and therefore do not limit the present invention. Therefore, among the structural elements in the following embodiment, structural elements not recited in any one of claims are not necessarily required to achieve the object of the present invention. Note that, the diagrams are schematic diagrams, and the illustration is not always strictly accurate. Also note that in each diagrams, the same reference numbers indicate elements with the substantially same configuration, operation, and effect.

Figure 1:
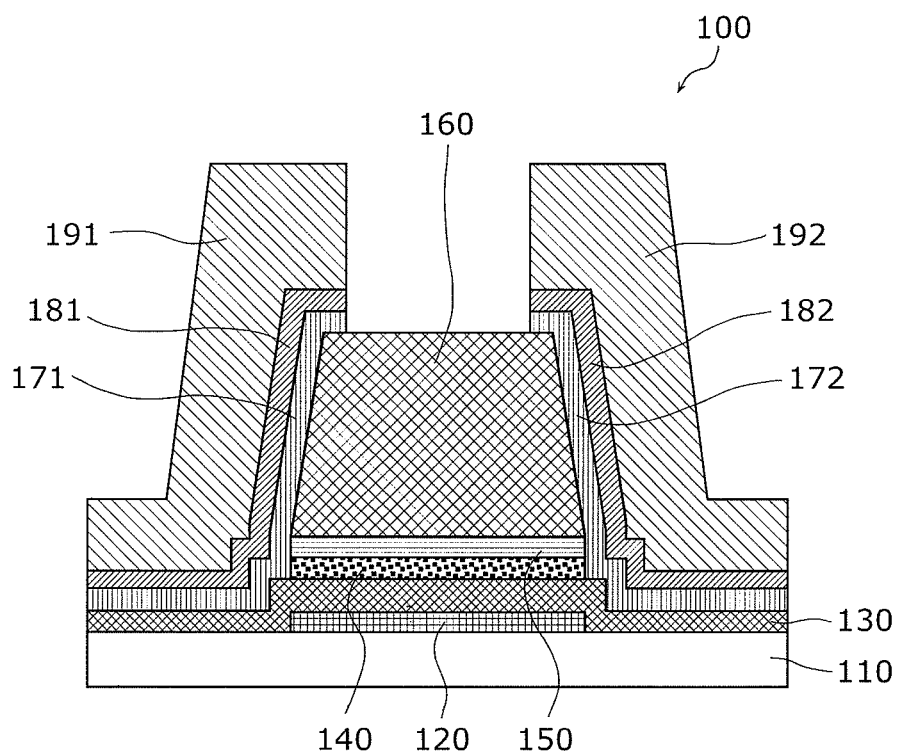
FIG. 1 is a cross-sectional view illustrating a configuration of a thin-film semiconductor device according to the embodiment of the present invention.

First, referring to FIG. 1, a description is given of a configuration of a thin-film semiconductor device 100 according to the embodiment of the present invention. FIG. 1 is a cross-sectional view schematically illustrating a configuration of the thin-film semiconductor device 100 according to the embodiment.

As illustrated in FIG. 1, the thin-film semiconductor device 100 includes: a substrate 110; a gate electrode 120; a gate insulating film 130; a channel layer 140; a first amorphous semiconductor layer 150; a channel protective layer 160; a pair of second amorphous semiconductor layers 171 and 172; a pair of contact layers 181 and 182; a source electrode 191; and a drain electrode 192. The thin-film semiconductor device 100 is a bottom-gate thin-film transistor formed by stacking these elements in the mentioned order.

The substrate 110 is a glass substrate made of, for example, a glass material such as silica glass, alkali-free glass, or highly heat-resistant glass. An undercoat layer made of a silicon nitride ($SiN_x$) film, a silicon oxide ($SiO_y$) film, a silicon oxynitride ($SiO_yN_x$) film, or others may be formed on the substrate 110 in order to prevent impurity such as sodium and phosphorus in the glass substrate from entering the channel layer 140. In addition, the undercoat layer may also function as a layer for buffering the heat on the substrate 110 in a high-temperature thermal treatment process such as laser annealing. The thickness of the undercoat layer is, for example, approximately 100 nm to approximately 2000 nm.

The gate electrode 120 is patterned on the substrate 110 in a predetermined shape. Examples of a material for the gate electrode 120 include molybdenum (Mo), aluminum (Al), copper (Cu), tungsten (W), titanium (Ti), chromium (Cr), and molybdenum-tungsten (MoW). The thickness of the gate electrode 120 is approximately 20 to approximately 500 nm, for example.

The gate insulating film 130 is formed on the entire surface of the substrate 110 so as to cover the gate electrode 120. The gate insulating film 130 is made of, for example, a single-layer film of silicon oxide ($SiO_y$), silicon nitride ($SiN_x$), silicon oxynitride ($SiO_yN_x$), aluminum oxide ($AlO_z$), or tantalum oxide ($TaO_w$), or a stacked film of the materials. The thickness of the gate insulating film 130 is, for example, 50 nm to 300 nm.

In this embodiment, since the channel layer 140 is made of a crystalline silicon thin film as described later, silicon oxide is used for the gate insulating film 130, for example. Silicon oxide is suitable for achieving satisfactory interface state between the channel layer 140 and the gate insulating film 130, which improves the threshold voltage characteristics of the thin-film semiconductor device 100.

The channel layer 140 is a semiconductor film patterned at a position overlapping the gate electrode 120 on the gate insulating film 130, and has a predetermined channel region which is a region in which carrier movement is controlled by the voltage at the gate electrode 120.

In this embodiment, the gate electrode 120 and the channel layer 140 are stacked such that the outlines coincide with one another in a top view. Here, "the outlines coincide with one another" refers to a state in which the gate electrode 120 and the channel layer 140 have the same shape (same shape and same area), and the gate electrode 120 and the channel layer 140 are provided without misplaced from each other in the horizontal direction.

The channel layer 140 is a crystalline silicon thin film having a crystalline structure, and is made of a microcrystalline silicon thin film or a polycrystalline silicon thin film. The channel layer 140 may be formed by crystallizing non-crystalline amorphous silicon, for example. The channel layer 140 may be formed as a silicon thin film having a mixed crystal structure of amorphous silicon (non-crystalline silicon) and crystalline silicon. In this case, in order to achieve excellent on-characteristics, at least the channel region is formed of a film having a high ratio of crystalline silicon, for example. The thickness of the channel layer 140 is, for example, approximately 30 nm to approximately 200 nm. The orientation of the principal plane of the silicon crystals in the channel layer 140 is [100], for example. With this, it is possible to form the channel layer 140 having excellent crystallinity.

The average crystal grain size of the crystalline silicon in the channel layer 140 is approximately 5 nm to approximately 1000 nm. In the channel layer 140, polycrystals having an average grain size greater than or equal to 100 nm, or microcrystals (μc) having an average grain size of 10 nm to 100 nm are included.

The first amorphous semiconductor layer 150 is patterned on the channel layer 140. In this embodiment, the gate electrode 120, the channel layer 140, and the first amorphous semiconductor layer 150 are stacked such that the outlines coincide with one another in a top view.

The first amorphous semiconductor layer 150 is made of an amorphous silicon film (intrinsic amorphous silicon) which is intentionally not doped with an impurity, for example. The first amorphous semiconductor layer 150 has a higher density of localized states (trap density) than the channel layer 140. More specifically, the electric field can be shielded by cancelling positive fixed charge in the channel protective layer 160 by the charge density of the negative carriers in the first amorphous semiconductor layer 150. With this, it is possible to suppress formation of a back channel, suppressing the leakage current when the thin-film semiconductor device 100 is turned off. Accordingly, the off-characteristics of the thin-film semiconductor device 100 are improved.

The channel protective layer 160 is patterned at a position overlapping the channel layer 140 on the first amorphous semiconductor layer 150. In this embodiment, the gate electrode 120, the channel layer 140, the first amorphous semiconductor layer 150, and the channel protective layer 160 are stacked such that the outlines coincide with one another in a top view.

The channel protective layer 160 illustrated in FIG. 1 has a tapered shape having a smaller cross-sectional area from the lower surface toward the upper surface. Accordingly, at least the outline on the lower surface of the channel protective layer 160 coincides with the outlines of the gate electrode 120, the channel layer 140, and the first amorphous semiconductor layer 150.

The channel protective layer 160 functions as a channel etching stopper (CES) layer for protecting the channel layer 140 and the first amorphous semiconductor layer 150. More specifically, the channel protective layer 160 has a function of preventing the channel layer 140 and the first amorphous semiconductor layer 150 from being etched during the etching process for forming the pair of second amorphous semiconductor layers 171 and 172 and the pair of contact layers 181 and 182.

As a material for forming the channel protective layer 160, an organic material mainly containing silicon, oxygen, and carbon is used, for example The channel protective layer 160 according to the embodiment can be formed by patterning and solidifying a photosensitive application type organic material.

The organic material for forming the channel protective layer 160 includes, for example, an organic resin material, a surface activating agent, a solvent, and a photosensitizing agent. As the organic resin material, photosensitive or non-photosensitive organic resin material comprising one or more of polyimide, acrylic, polyamide, polyimide-amide, resist, benzocyclobutene, and others may be used. As the surface activating agent, a surface activating agent comprising a silicon compound such as siloxane may be used. As the solvent, an organic solvent such as propyleneglycol monomethylether acetate or 1, 4-dioxane may be used. As the photosensitizing agent, a positive photosensitizing agent such as naphthoquinone diazide may be used. Note that, the photosensitizing agent includes not only carbon, but also sulfur.

When forming the channel protective layer 160, the organic material may be formed by a coating method such as the spin coating. In addition to the coating method, the channel protective layer 160 may be formed by a method such as the liquid drop ejection method. An organic material may be selectively formed in a predetermined shape by using a printing method such as the screen printing or the offset printing which allow formation of the predetermined pattern.

The thickness of the channel protective layer 160 is 300 nm to 1000 nm, for example. The minimum thickness of the channel protective layer 160 is determined in consideration of a margin for channel etching and aiming for suppressing the influence of the fixed charge in the channel protective layer 160. The maximum thickness of the channel protective layer 160 is determined aiming for suppressing the decrease in the reliability of process due to an increase in the thickness of a step between (i) the channel protective layer 160 and (ii) the second amorphous semiconductor layers 171 and 172, the contact layers 181 and 182, the source electrode 191, or the drain electrode 192.

The pair of second amorphous semiconductor layers 171 and 172 is patterned so as to cover the channel protective layer 160, the first amorphous semiconductor layer 150, and the channel layer 140. The second amorphous semiconductor layer 171 and the second amorphous semiconductor layer 172 are provided opposite to each other with a predetermined interval.

More specifically, the second amorphous semiconductor layer 171 is formed across a part of the upper surface of the channel protective layer 160, a side surface on one side (left side in FIG. 1) of the channel protective layer 160, a side surface on one side (left side in FIG. 1) of the first amorphous semiconductor layer 150, and a side surface on one side (left side in FIG. 1) of the channel layer 140. The second amorphous semiconductor layer 171 contacts the side surface on the one side of the channel layer 140.

The second amorphous semiconductor layer 172 is formed across a part of the upper surface of the channel protective layer 160, a side surface on the other side (right side in FIG. 1) of the channel protective layer 160, a side surface on the other side (right side in FIG. 1) of the first amorphous semiconductor layer 150, and a side surface on the other side (right side in FIG. 1) of the channel layer 140. The second amorphous semiconductor layer 172 contacts the side surface on the other side of the channel layer 140.

In this embodiment, the second amorphous semiconductor layers 171 and 172 extend from the upper surface of the channel protective layer 160 to the side surfaces of the channel layer 140; however, the present invention is not limited to this example. The second amorphous semiconductor layers 171 and 172 may cover at least the side surfaces of the channel layer 140. The same also applies to the contact layers 181 and 182, the source electrode 191, and the drain electrode 192.

The second amorphous semiconductor layers 171 and 172 may be formed of an amorphous silicon film (intrinsic amorphous silicon) which is intentionally not doped with an impurity. When the effect on the on-resistance is too large, the second amorphous semiconductor layers 171 and 172 may be formed of a layer which is doped with an impurity at a concentration lower than the contact layers 181 and 182 by the exponent decreased by one or two. Alternatively, even without intentional doping, the layer having the above concentration may also be formed by using memory effects due to residual dopant in the chamber for doping. The second amorphous semiconductor layers 171 and 172 according to the present embodiment comprises only non-crystalline amorphous components, and are not intentionally crystallized.

Furthermore, the first amorphous semiconductor layer 150 and the pair of second amorphous semiconductor layers 171 and 172 are formed to have different level of density of localized states (localized level) and band gap. More specifically, the density of localized states of the first amorphous semiconductor layer 150 is higher than the density of localized states of the second amorphous semiconductor layers 171 and 172. On the other hand, the band gaps of the second amorphous semiconductor layers 171 and 172 are larger than the band gap of the first amorphous semiconductor layer 150. Here, the density of localized states refers to defect level density (trap density) in a semiconductor film, and represents density of state (DOS) of electric charge.

In the present embodiment, the density of localized states of the first amorphous semiconductor layer 150 is [$1 \times 10^{18}$] $cm^{-3}$, and the density of localized states of the second amorphous semiconductor layers 171 and 172 is [$1 \times 10^{17}$] $cm^{-3}$. The band gap of the first amorphous semiconductor layer 150 is [1.3] eV, and the band gaps of the second amorphous semiconductor layers 171 and 172 are [1.7] eV.

The pair of contact layers 181 and 182 are respectively stacked on the pair of second amorphous semiconductor layers 171 and 172. The contact layer 181 and the contact layer 182 are provided opposite to each other with a predetermined interval. The contact layer 181 contacts the side surface on one side of the channel layer 140 (left side in FIG. 1) via the second amorphous semiconductor layer 171. In the similar manner, the contact layer 182 contacts the side surface on the other side of the channel layer 140 (right side in FIG. 1) via the second amorphous semiconductor layer 172.

The contact layers 181 and 182 are amorphous semiconductor films containing impurity at high concentration, and are $n^+$ layers each including a high concentration of impurity at least $1 \times 10^{19}$ [$atm/cm^3$]. More specifically, the contact layers 181 and 182 are made of n-type semiconductor films formed by doping amorphous silicon with phosphorus (P) as the impurity. The thickness of the contact layers 181 and 182 is 5 nm to 100 nm, for example.

The source electrode 191 and the drain electrode 192 are patterned at positions on the contact layers 181 and 182 overlapping the channel layer 140. More specifically, the source electrode 191 and the drain electrode 192 are disposed opposite to each other with a predetermined interval.

In this embodiment, each of the source electrode 191 and the drain electrode 192 may be a single-layer structure or multilayer structure that comprises a conductive material, an alloy including the material, or the like. For example, the source electrode 191 and the drain electrode 192 comprise aluminum (Al), molybdenum (Mo), tungsten (W), copper (Cu), titanium (Ti), or chromium (Cr). In this embodiment, the source electrode 191 and the drain electrode 192 are formed as a tri-layer structure of MoW/Al/MoW. The thickness of the source electrode 191 and the drain electrode 192 is, for example, approximately 100 nm to approximately 500 nm.

In such a manner, in the thin-film semiconductor device 100 according to the present embodiment, the gate electrode 120, the channel layer 140, the first amorphous semiconductor layer 150, and the channel protective layer 160 have the outlines that coincide with one another in a top view. As described later, these outlines coincide with one another due to self-alignment.

Figure 2A:
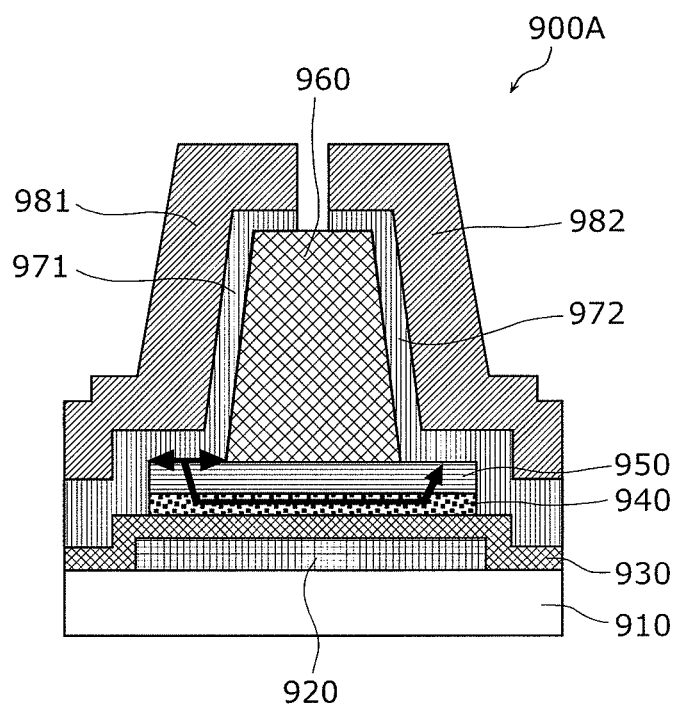
FIG. 2A illustrates a configuration a function and effect of a thin-film semiconductor device of a comparative example 1.
Figure 2B:
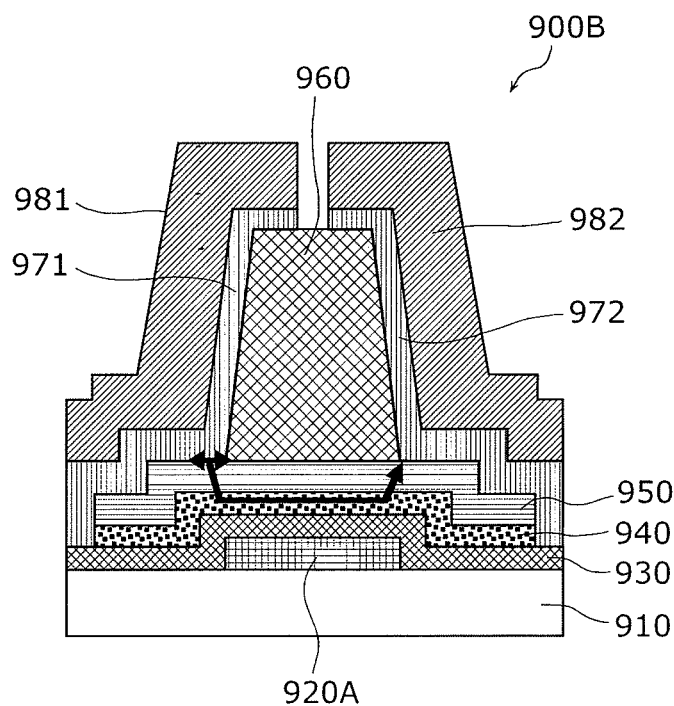
FIG. 2B illustrates a configuration, a function and effect of a thin-film semiconductor device of a comparative example 2.
Figure 2C:
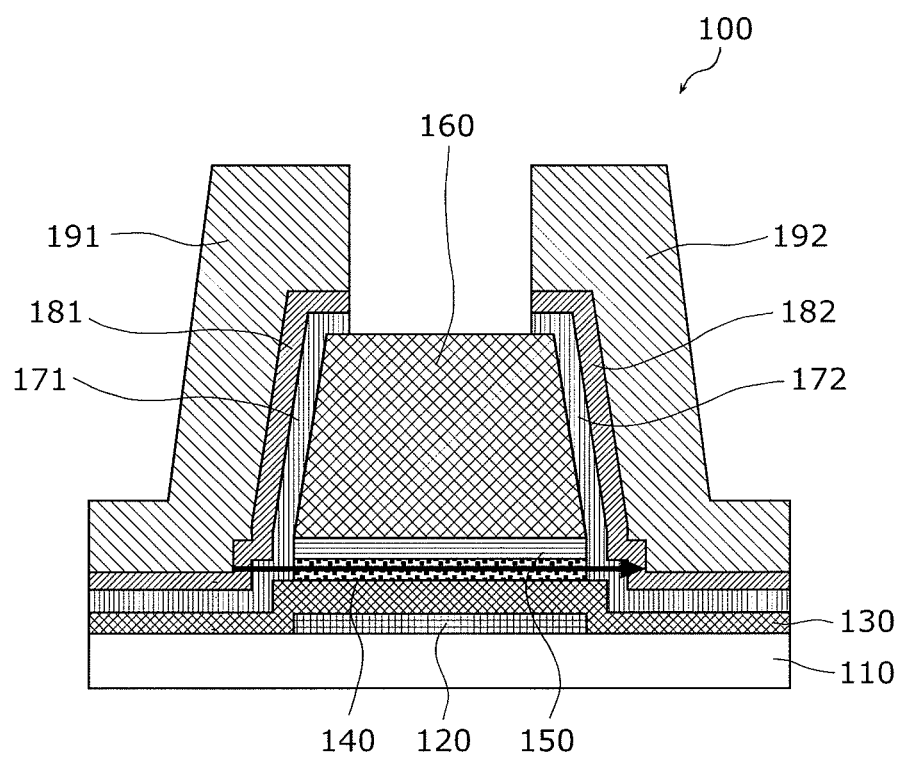
FIG. 2C illustrates a configuration, a function and effect of the thin-film semiconductor device according to the embodiment of the present invention.

Here, each of FIG. 2A, FIG. 2B, and FIG. 2C illustrates an operation and effect of the thin-film semiconductor device 100 according to the present embodiment. FIG. 2A illustrates a configuration, an operation and effect of a thin-film semiconductor device 900A according to a comparative example 1. FIG. 2B illustrates a configuration, an operation and effect of a thin-film semiconductor device 900B according to a comparative example 2. FIG. 2C illustrates a configuration, an operation and effect of the thin-film semiconductor device 100 according to the present embodiment.

As illustrated in FIG. 2A, in the thin-film semiconductor device 900A according to the comparative example 1, the outlines of a gate electrode 920, a crystalline silicon layer 940, a non-crystalline silicon layer 950, and a channel protective layer 960 do not coincide with one another due to no self-alignment unlike the present embodiment. Hence, the gate electrode 920, the crystalline silicon layer 940, and the non-crystalline silicon layer 950 are longer than the channel protective layer 960. Hence, in the thin-film semiconductor device 900A according to the comparative example 1, current can be injected from a large contact region. Since the contact region above the non-crystalline silicon layer 950 that is above the gate electrode 920 is large (that is, the region to which voltage is applied is large) although the resistance of the non-crystalline silicon layer 950 (amorphous silicon) is high, carrier injection characteristics are relatively satisfactory.

However, in the thin-film semiconductor device 900A according to the comparative example 1, although the crystalline silicon layer 940 (polysilicon) directly contacts the contact layer 971 at the both lateral sides of the crystalline silicon layer 940 without the non-crystalline silicon layer 950 in between, the contact region above the non-crystalline silicon layer 950 is dominant. Hence, no direct injection of carriers from the contact layer 971 to the crystalline silicon layer 940 substantially occurs. Furthermore, the thin-film semiconductor device 900A according to the comparative example 1 also has a problem that parasitic capacitance is large because the gate electrode 920 is long.

Furthermore, as illustrated in FIG. 2B, in the thin-film semiconductor device 900B according to the comparative example 2, the channel protective layer 960 and the gate electrode 920A are self-aligned, and the crystalline silicon layer 940 and the non-crystalline silicon layer 950 are not self-aligned. More specifically, although the outlines of the channel protective layer 960 and the gate electrode 920A coincide with one another, the outlines of the channel protective layer 960 and the gate electrode 920A do not coincide with the outlines of the crystalline silicon layer 940 and the non-crystalline silicon layer 950. The crystalline silicon layer 940 and the non-crystalline silicon layer 950 are longer than the gate electrode 920A and the channel protective layer 960.

In this case, since the outlines of the channel protective layer 960 and the gate electrode 920A coincide with one another, parasitic capacitance can be decreased.

However, although the area of contact between the non-crystalline silicon layer 950 and the contact layer 971 are large, the contact area is not positioned above the gate electrode 920A. Hence, voltage is not applied to the contact region, causing no carrier injection. As a result, carriers are injected from a small contact region that is only a small region to which voltage is applied, thereby significantly decreasing current characteristics. In this case, too, in the similar manner to the comparative example 1, carrier injection from the non-crystalline silicon layer 950 is dominant. Hence, even though the crystalline silicon layer 940 directly contacts the contact layer 971, no direct injection of carriers from the contact layer 971 to the crystalline silicon layer 940 substantially occurs.

In contrast, as illustrated in FIG. 2C, in the thin-film semiconductor device 100 according to the present embodiment, the outline of the gate electrode 120 coincides with the outline on the lower surface of the channel protective layer 160 in a top view. With this, in the cross-section illustrated in FIG. 1, the lateral end portions on the lower surface of the channel protective layer 160 are positioned on lines extended from the lateral side surfaces of the gate electrode 120. As a result, the gate electrode 120 do not overlap the source electrode 191 and the drain electrode 192 in regions on the left and right of the channel protective layer 160. Accordingly, parasitic capacitance in the regions can be decreased.

Furthermore, in the thin-film semiconductor device 100, the gate electrode 120, the channel layer 140 (crystalline silicon), and the first amorphous semiconductor layer (amorphous silicon) have the outlines which coincide with one another. With this, the second amorphous semiconductor layers 171 and 172 directly contact the side surfaces of the channel layer 140, and the contact layers 181 and 182 contact the side surfaces of the channel layer 140 via the second amorphous semiconductor layers 171 and 172. Accordingly, carrier injection from the channel layer 140 is not dominant, allowing current to be directly injected from the side surface of the channel layer 140. Hence, the current path formed when voltage is applied to the gate electrode 120 includes the source electrode 191, the contact layer 181, the second amorphous semiconductor layer 171, the channel layer 140, the second amorphous semiconductor layer 172, the contact layer 182, and the drain electrode 192. Accordingly, the high-resistance first amorphous semiconductor layer 150 can be excluded from the current path, allowing a decrease in the on-resistance.

In such a manner, the thin-film semiconductor device 100 can accomplish both an increase in carrier injection characteristics and a decrease in parasitic capacitance.

Furthermore, by increasing the density of localized states of the first amorphous semiconductor layer 150, it is possible to suppress back channel effects caused by fixed charges included in the channel protective layer 160. On the other hand, by increasing the band gaps of the second amorphous semiconductor layers 171 and 172, it is possible to increase the off-characteristics. By providing the first amorphous semiconductor layer 150 having an increased density of localized states, and the second amorphous semiconductor layers 171 and 172 with increased band gaps in such a manner, the performance of the thin-film semiconductor device 100 can be significantly improved compared to the case where the density of localized states and the band gap of the non-crystalline silicon layer 950 (corresponding to the first amorphous semiconductor layer 150 in FIG. 1) is increased as conventionally performed.

Next, referring to FIG. 3A to FIG. 3K, a description is given of the method for fabricating the thin-film semiconductor device according to the present embodiment. FIG. 3A to FIG. 3K are cross-sectional views schematically illustrating the process in the method for fabricating the thin-film transistor device according to the present embodiment.

Figure 3A:
FIG. 3A is a cross-sectional view schematically illustrating a substrate preparation process in a method for fabricating the thin-film semiconductor device according to the embodiment of the present invention.

First, as illustrated in FIG. 3A, the substrate 110 is prepared. Note that, an undercoat layer made of a silicon nitride film, a silicon oxide film, a silicon oxynitride film or others may be formed on the substrate 110 by the plasma CVD or others, before the gate electrode 120 is formed.

Figure 3B:
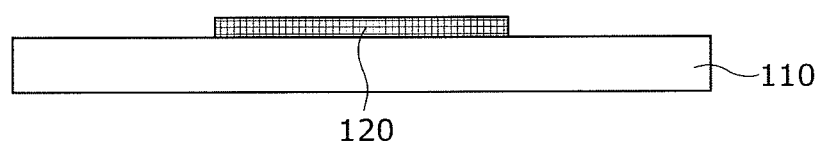
FIG. 3B is a cross-sectional view schematically illustrating a gate electrode forming process in the method for fabricating the thin-film semiconductor device according to the embodiment of the present invention.

Next, as illustrated in FIG. 3B, the gate electrode 120 in the predetermined shape is formed on the substrate 110. For example, a gate metal film comprising MoW is formed on the substrate 110 by sputtering. The gate electrode 120 in the predetermined shape can be formed by patterning the gate metal film using the photolithography and the wet etching. The wet etching on MoW may be performed using a chemical solution which is a mixture of phosphoric acid ($HPO_4$), nitric acid ($HNO_3$), acetic acid ($CH_3COOH$) and water in a predetermined ratio, for example.

Figure 3C:
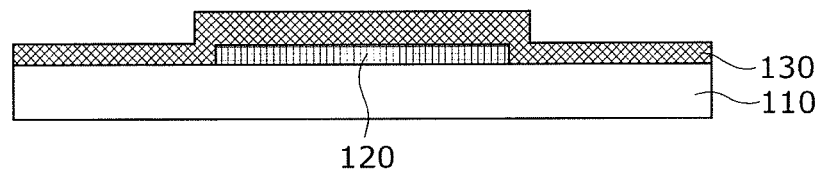
FIG. 3C is a cross-sectional view schematically illustrating a gate insulating film forming process in the method for fabricating the thin-film semiconductor device according to the embodiment of the present invention.

Next, as illustrated in FIG. 3C, the gate insulating film 130 is formed on the entire upper surface of the substrate 110 so as to cover the gate electrode 120. For example, the gate insulating film 130 made of silicon oxide is formed by the plasma CVD or others. Silicon oxide is formed by introducing silane gas ($SiH_4$) and nitrous oxide gas ($N_2O$) in a predetermined ratio of concentration, for example.

Figure 3D:
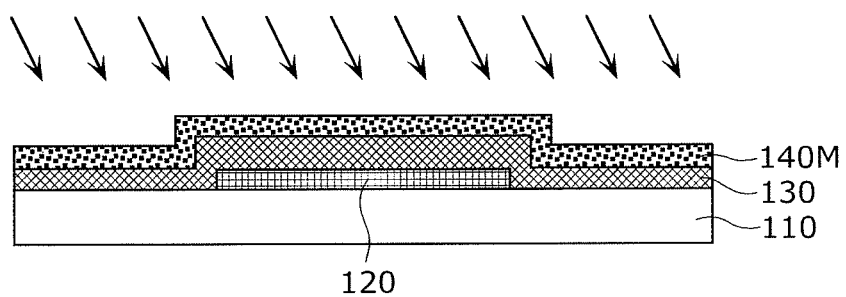
FIG. 3D is a cross-sectional view schematically illustrating a crystalline silicon thin film forming process in the method for fabricating the thin-film semiconductor device according to the embodiment of the present invention.

Next, as illustrated in FIG. 3D, a crystalline silicon thin film 140M to be the channel layer 140 is formed on the entire upper surface of the gate insulating film 130. The crystalline silicon thin film 140M can be formed, for example, as follows: first, a non-crystalline silicon thin film comprising amorphous silicon is formed by the plasma CVD or others and a dehydrogenation annealing is performed; after that, the non-crystalline silicon thin film is annealed for crystallization. The non-crystalline silicon thin film is formed by introducing silane gas ($SiH_4$) and hydrogen gas ($H_2$) in a predetermined ratio of concentration, for example.

In this embodiment, the amorphous silicon thin film is crystallized by the laser annealing using the excimer laser. As the method for crystallization, the laser annealing using a pulse laser with a wavelength of approximately 370 nm to approximately 900 nm, the laser annealing using the continuous wave laser with a wavelength of approximately 370 nm to approximately 900 nm, or the annealing by the rapid thermal processing (RTP) may be used. Alternatively, the crystalline silicon thin film 140M may be formed by a method such as direct growth by the CVD, instead of crystallizing the non-crystalline silicon thin film.

Subsequently, by performing hydrogen plasma treatment on the crystalline silicon thin film 140M, silicon atoms in the crystalline silicon thin film 140M are hydrotreated. The hydrogen plasma treatment is performed, for example, by generating hydrogen plasma from gas containing hydrogen gas such as $H_2$, $H_2$/argon (Ar), using a radio frequency (RF) power, and by irradiating the crystalline silicon thin film 140M with the hydrogen plasma. With the hydrogen plasma treatment, the dangling bond (defect) of silicon atoms are hydrogen terminated. As a result, the crystal defect density of the crystalline silicon thin film 140M is decreased, improving the crystallinity.

Figure 3E:
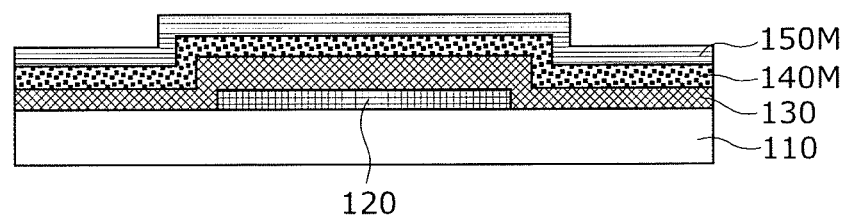
FIG. 3E is a cross-sectional view schematically illustrating a first amorphous silicon film forming process in the method for fabricating the thin-film semiconductor device according to the embodiment of the present invention.

Next, as illustrated in FIG. 3E, a first amorphous silicon film 150M that is a precursor film of the first amorphous semiconductor layer 150 is formed on the entire upper surface of the crystalline silicon thin film 140M. The first amorphous silicon film 150M can be formed by introducing silane gas ($SiH_4$) and hydrogen gas ($H_2$) in a predetermined ratio of concentration, by the CVD, for example.

The first amorphous silicon film 150M can be formed, for example, as follows: silane gas ($SiH_4$) and hydrogen gas ($H_2$) are introduced in a predetermined ratio of concentration by a parallel plate RF plasma CVD device, where the flow rate of silane gas is from 5 to 15 sccm, the flow rate of hydrogen gas is from 40 to 75 sccm, the pressure is from 1 to 5 Torr, the RF power is from 0.1 to 0.4 kw/cm$^{-2}$, and the electrode-to-substrate distance is from 200 to 600 mm. In this embodiment, for example, the first amorphous silicon film 150M is formed by a parallel plate RF plasma CVD device with electrodes each having a diameter of 10 inch, where the ratio of the flow rate of silane gas to the flow rate of hydrogen gas is 1:7, the pressure is 5 Torr, the RF power is 0.2 kw/cm$^{-2}$, and the electrode-to-substrate distance is 300 mm.

The first amorphous silicon film 150M has high absorptance of light used in an exposure process to be described later. Accordingly, if the first amorphous silicon film 150M is too thick, the insulating film 160M does not obtain necessary amount of exposure, which may result in insufficient exposure of the insulating film 160M. There is also another possibility that the exposure for a long time would be necessary to obtain necessary amount of exposure, which could result in significantly degraded productivity. In consideration of these possibilities, the thickness of the first amorphous silicon film 150M is 50 nm at most, for example. However, if the amount of light used for the exposure process is increased, the thickness of the first amorphous silicon film 150M may be greater than or equal to 50 nm.

Figure 3F:
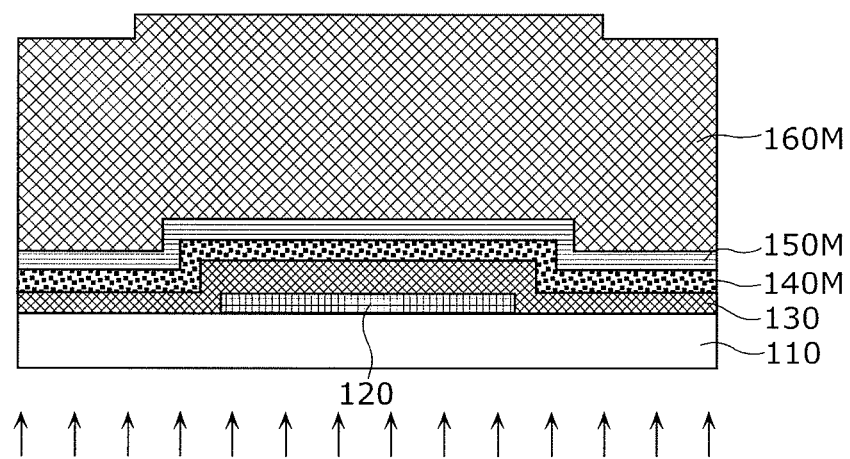
FIG. 3F is a cross-sectional view schematically illustrating an insulating film forming process in the method for fabricating the thin-film semiconductor device according to the embodiment of the present invention.

Next, as illustrated in FIG. 3F, an insulating film 160M to be the channel protective layer 160 is formed on the entire upper surface of the first amorphous silicon film 150M. More specifically, first, an organic material serving as a precursor of the channel protective layer 160 is applied on the first amorphous silicon film 150M by a predetermined application method, and the insulating film 160M is formed on the entire upper surface of the first amorphous silicon film 150M by the spin coating or the slit-coating. The thickness of the organic material may be controlled by the viscosity of the organic material and coating conditions (the number of rotations, the speed of blade, and others). As a material for the insulating film 160M, a photosensitive application type organic material containing silicon, oxygen, and carbon may be used.

Figure 3G:
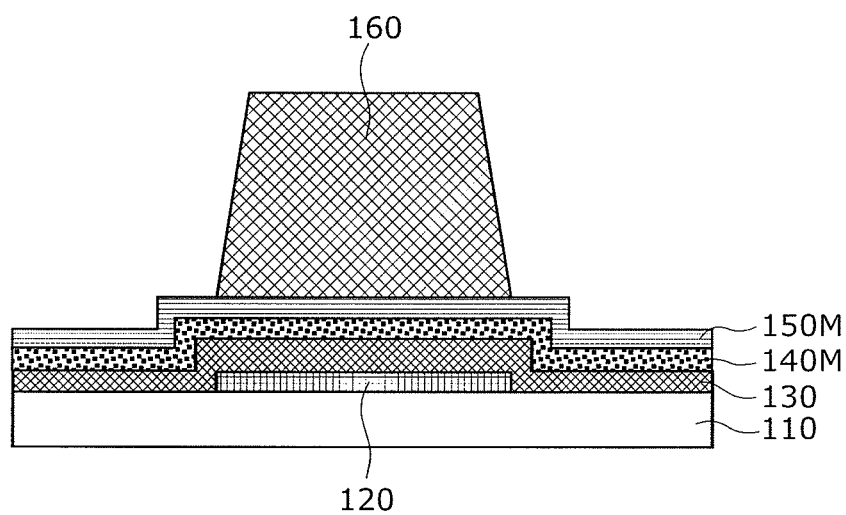
FIG. 3G is a cross-sectional view schematically illustrating a channel protective layer forming process in the method for fabricating thin-film semiconductor device according to the embodiment of the present invention.

Next, the insulating film 160M is prebaked for approximately 60 seconds at the temperature of approximately 110° C. With this process, the solvent in the insulating film 160M evaporates. Subsequently, the insulating film 160M is exposed to light emitted from the back surface side of the substrate 110 (a surface on the opposite side of the surface on which the gate electrode 120 is formed) using the gate electrode 120 as a mask. Subsequently, the exposed insulating film 160M is patterned, forming the channel protective layer 160 in the predetermined shape in the region overlapping the gate electrode 120 as illustrated in FIG. 3G.

Next, the patterned channel protective layer 160 is postbaked for approximately one hour at the temperature of 280° C. to 300° C. so as to solidify the channel protective layer 160. With this, part of the organic component evaporates or decomposed, and the channel protective layer 160 with improved film quality is formed.

As described above, by exposing the insulating film 160M using, as a mask, the gate electrode 120 comprising the light-shielding conductive material, the gate electrode 120 and the lower surface of the channel protective layer 160 are self-aligned and have the outlines that coincide with one another. Accordingly, the gate electrode 120 does not overlap the source electrode 191 and the drain electrode 192 in regions on the left or right of the channel protective layer 160, thereby decreasing the parasitic capacitance in the regions.

Figure 4:
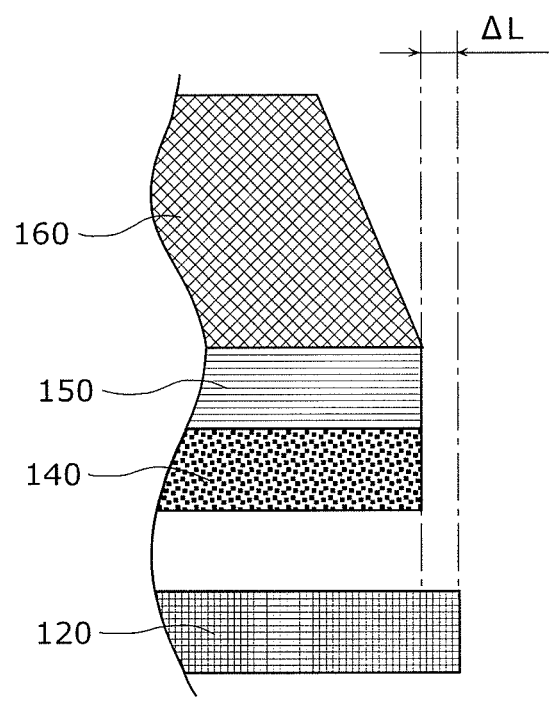
FIG. 4 illustrates an example of stack relationship of the gate electrode, the channel layer, the first amorphous semiconductor layer, and the channel protective layer.

When the insulating film 160M is patterned, the channel protective layer 160 becomes smaller than the desired size by $\Delta L$, as illustrated in FIG. 4. To put it differently, the outline on the lower surface of the channel protective layer 160 recedes inside the outline of the upper surface of the gate electrode 120. In addition, the channel layer 140 and the first amorphous semiconductor layer 150 are formed by using the channel protective layer 160 as a mask, as will be described layer. Accordingly, the outlines of the channel layer 140 and the first amorphous semiconductor layer 150 fall inside the outline of the gate electrode 120, in the same manner as the channel protective layer 160.

Now, referring to FIG. 4, a description is given of stacking relationship of the gate electrode 120, the channel layer 140, the first amorphous semiconductor layer 150, and the channel protective layer 160. Note that the gate insulating film 130 and others are not illustrated in FIG. 4. In this Specification, an error that is $\Delta L=0.5$ µm or less in the fabrication process is included in a range of "outlines that coincide with one another". Furthermore, $\Delta L$ may be set to a value equals to or greater than the thickness of the second amorphous semiconductor layers 171 and 172. With this, the second amorphous semiconductor layers 171 and 172 are formed at positions overlapping the gate electrode 120. Accordingly, the on-resistance can be decreased.

More specifically, in this embodiment, it may be that $\Delta L$ is 0 (the outlines of the gate electrode 120, the channel layer 140, the first amorphous semiconductor layer 150, and the channel protective layer 160 completely coincide with one another), or $\Delta L$ is set to a value that is equal to or greater than the thickness of the second amorphous semiconductor layers 171 and 172 and equal to or less than 0.5 µm.

Figure 3H:
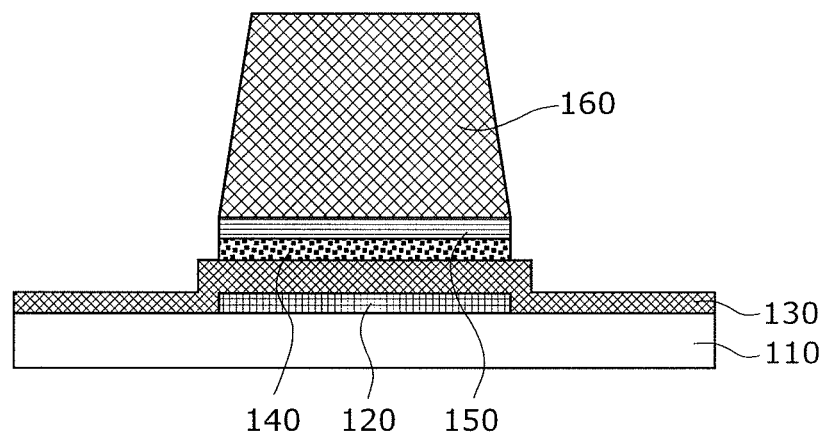
FIG. 3H is a cross-sectional view schematically illustrating a channel layer/a first amorphous semiconductor layer forming process in the method for fabricating the thin-film semiconductor device according to the embodiment of the present invention.

Next, dry etching on the crystalline silicon thin film 140M and the first amorphous silicon film 150M are performed using the channel protective layer 160 as a mask. With this, as illustrated in FIG. 3H, the channel layer 140 and the first amorphous semiconductor layer 150 are formed simultaneously at positions overlapping the gate electrode 120.

By using the channel protective layer 160 as a mask, the outlines of the channel layer 140 and the first amorphous semiconductor layer 150 coincide with the outline on the lower surface of the channel protective layer 160 due to self-alignment. With this, it is possible for the second amorphous semiconductor layers 171 and 172 to be formed in the process described later to directly contract the side surfaces of the channel layer 140. Consequently, the high-resistance first amorphous semiconductor layer 150 is not included in current path between the source electrode 191 and the channel layer 140 and between the drain electrode 192 and the channel layer 140. Accordingly, it is possible to decrease the on-resistance.

Figure 3I:
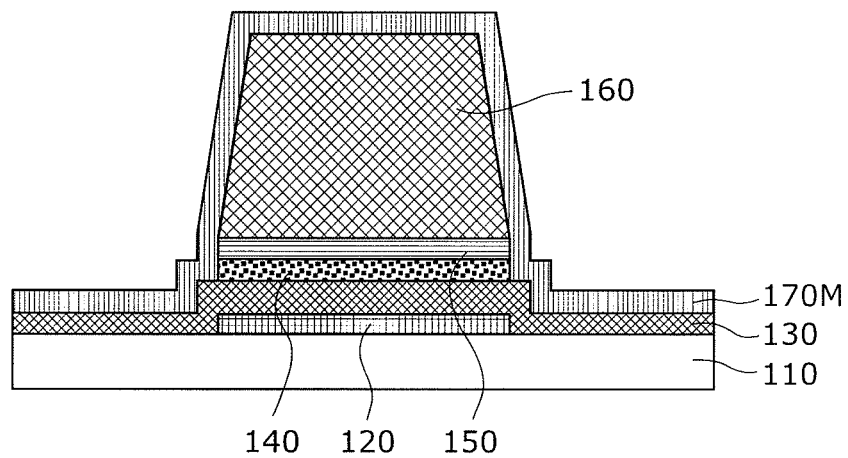
FIG. 3I is a cross-sectional view schematically illustrating a second amorphous silicon film forming process in the method for fabricating the thin-film semiconductor device according to the embodiment of the present invention.

Next, as illustrated in FIG. 3I, an intrinsic second amorphous silicon film 170 M to be the pair of second amorphous semiconductor layers 171 and 172 is formed so as to cover the channel protective layer 160 and the gate insulating film 130. The intrinsic second amorphous silicon film 170M may be formed by, for example, the plasma CVD. The intrinsic second amorphous silicon film 170M may be formed by introducing silane gas ($SiH_4$) and hydrogen gas ($H_2$) in a predetermined ratio of concentration, for example. In this embodiment, for example, the intrinsic second amorphous silicon film 170M is formed by a parallel plate RF plasma CVD device with electrodes each having a diameter of 10 inch, where the ratio of the flow rate of silane gas to the flow rate of hydrogen gas is 6:1, the pressure is 5 Torr, the RF power is 0.03 kw/cm$^{-2}$, and the electrode-to-substrate distance is 525 mm.

By differentiating the forming conditions of the first amorphous semiconductor layer 150 and the second amorphous semiconductor layers 171 and 172 as described above, it is possible to obtain the first amorphous semiconductor layer 150 having a relatively high density of localized states and the second amorphous semiconductor layers 171 and 172 having relatively large band gaps.

Figure 3J:
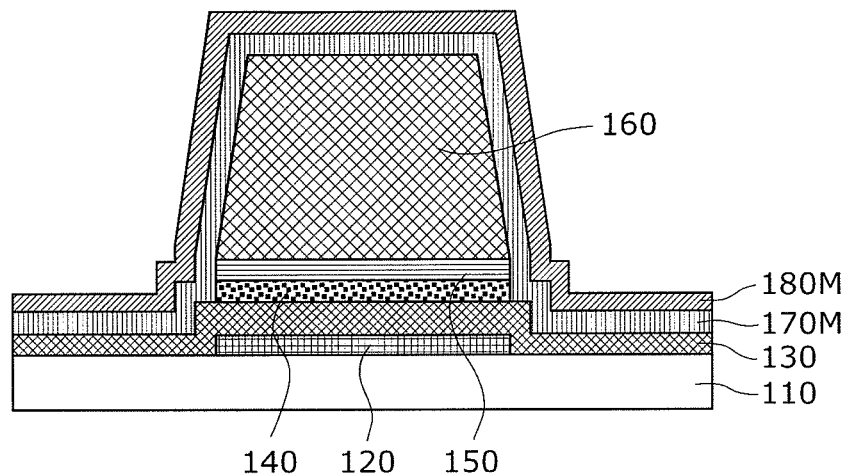
FIG. 3J is a cross-sectional view schematically illustrating a contact layer thin film forming process in the method for fabricating the thin-film semiconductor device according to the embodiment of the present invention.

Next, as illustrated in FIG. 3J, a contact layer film 180M to be the contact layers 181 and 182 is formed on the entire upper surface of the intrinsic second amorphous silicon film 170M. For example, the contact layer film 180M comprising an amorphous silicon doped with an impurity of pentavalent element such as phosphorous (P) is formed by the plasma CVD.

Note that, the contract layer film 180M may be made of two layers; namely, a lower low-concentration field limiting layer and an upper high-concentration contact layer. The low-concentration field limiting layer may be formed by doping phosphorus at approximately $1\times10^{17}$ (atm/cm$^3$). The two layers may be continuously formed by a CVD device, for example.

Figure 3K:
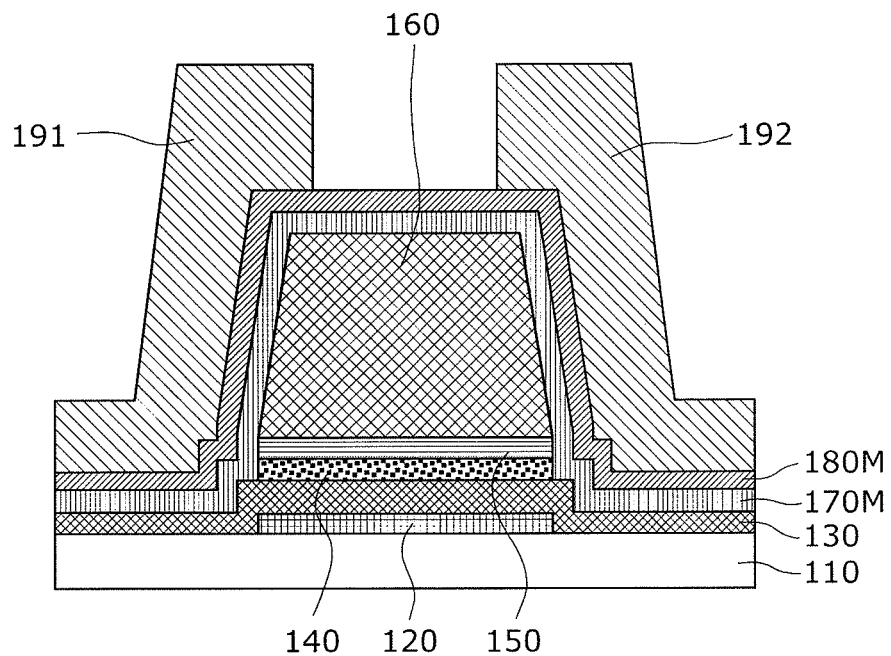
FIG. 3K is a cross-sectional view schematically illustrating a source electrode/drain electrode forming process in the method for fabricating the thin-film semiconductor device according to the embodiment of the present invention.

Next, the source electrode 191 and the drain electrode 192 are patterned on the contact layer film 180M, as illustrated in FIG. 3K. In this case, first, a source-drain metal film comprising a material to be the source electrode 191 and the drain electrode 192 are formed by sputtering, for example. Subsequently, a resist having a predetermined shape is patterned on the source-drain metal film, and the source-drain metal film is patterned by wet etching. Here, the contact layer film 180M serves as an etching stopper. Subsequently, the resist is removed, and the source electrode 191, and the drain electrode 192 in the predetermined shapes are formed.

Next, the contact layer film 180M and the intrinsic second amorphous silicon film 170M are patterned into island shape by performing dry etching using the source electrode 191 and the drain electrode 192 as masks. With this, the pair of contact layers 181 and 182, and the pair of second amorphous semiconductor layers 171 and 172 may be formed into predetermined shapes. Note that, chlorine gases may be used for the dry etching.

In this process, the pair of contact layers 181 and 182 and the pair of second amorphous semiconductor layers 171 and 172 are formed below the source electrode 191 and the drain electrode 192, respectively. The thin-film semiconductor device according to the present embodiment as illustrated in FIG. 1 is fabricated in such a manner.

Figure 5:
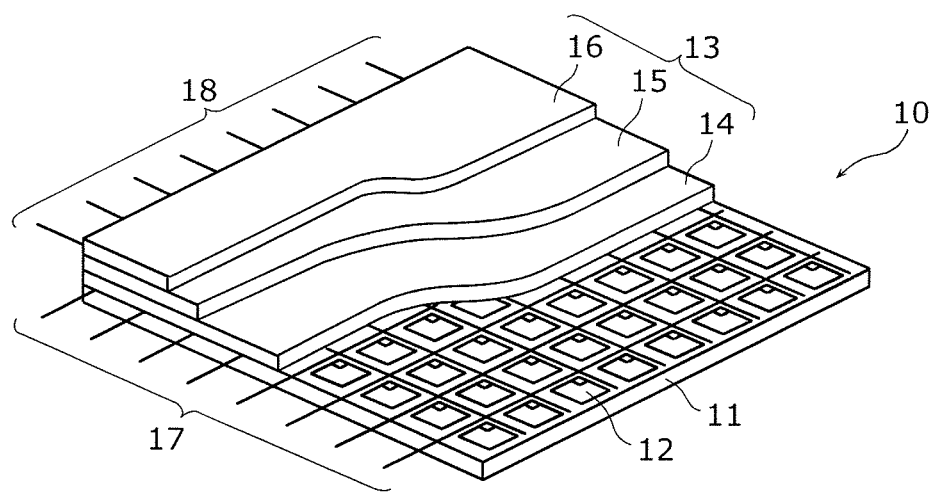
FIG. 5 is a partially cutaway perspective view of an organic EL display device according to the embodiment of the present invention.

Next, referring to FIG. 5, a description is given of an example where the thin-film semiconductor device 100 according to the present embodiment is applied to a display device. In this embodiment, a description is given of an example of application to an organic EL display device.

FIG. 5 is a partially cutaway perspective view of an organic EL display device according to the embodiment of the present invention. The thin-film semiconductor device 100 can be used as a switching transistor or a driving transistor for an active matrix substrate in the organic EL display device.

As illustrated in FIG. 5, the organic EL display device 10 includes: an active matrix substrate (TFT array substrate) 11; a plurality of pixels 12 arranged in a matrix on the active matrix substrate 11; an organic EL device 13 formed corresponding to different one of the pixels 12; a plurality of scan lines (gate lines) 17 formed along a row direction of the pixels 12; a plurality of video signal lines (source lines) 18 formed along a column direction of the pixels 12; and power lines 19 (not illustrated) formed in parallel with the video signal lines 18. The organic EL device 13 includes an anode 14, an organic EL layer 15, and a cathode 16 (transparent electrode) that are sequentially stacked on the active matrix substrate 11. In practice, a plurality of anodes 14 are formed corresponding to the pixels 12. The organic EL layer 15 includes a stack of an electron transport layer, an emission layer, a hole transport layer, and so on.

Figure 6:
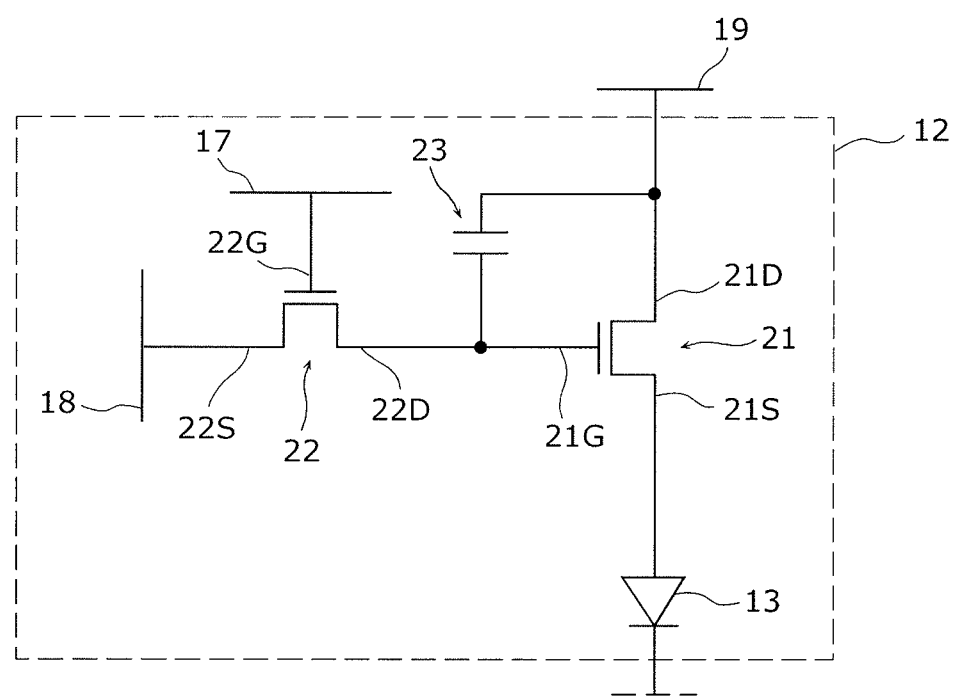
FIG. 6 illustrates a circuit configuration of a pixel which uses the thin-film semiconductor device according to the embodiment of the present invention.

Next, referring to FIG. 6, a description is given of a circuit configuration of the pixels 12 in the organic EL display device 10. FIG. 6 illustrates a circuit configuration of a pixel which uses the thin-film semiconductor device 100 according to the embodiment of the present invention.

As illustrated in FIG. 6, each pixel 12 is partitioned by the scan line 17 and the video signal line 18 that are orthogonal to each other, and includes a driving transistor 21, a switching transistor 22, a capacitor 23, and the organic EL device 13. The driving transistor 21 is a transistor that drives the organic EL device 13. The switching transistor 22 is a transistor that selects the pixel 12. One or both of the driving transistor 21 and the switching transistor 22 may be formed by the thin-film semiconductor device 100 illustrated in FIG. 1.

In the driving transistor 21, a gate electrode 21G is connected to a drain electrode 22D of the switching transistor 22, a source electrode 21S is connected to the anode of the organic EL device 13 via a relay electrode (not illustrated), and a drain electrode 21D is connected to the power line 19.

In addition, in the switching transistor 22, the gate electrode 22G is connected to the scan line 17, the source electrode 22S is connected to the video signal line 18, and the drain electrode 22D is connected to the capacitor 23 and the gate electrode 21G of the driving transistor 21.

In this configuration, when a gate signal is input into the scan line 17 to turn on the switching transistor 22, the video signal voltage supplied via the video signal line 18 is written into the capacitor 23. The video signal voltage written into the capacitor 23 is held for a period of one frame as hold voltage. This hold voltage causes analog change in the conductance of the driving transistor 21 and causes the driving current corresponding to luminescence gradation to flow from the anode to the cathode of the organic EL device 13. As a result, the organic EL device 13 emits light, and an image is displayed.

In this embodiment, descriptions have been given of the organic EL display device using the organic EL device, but the thin-film semiconductor device according to the present embodiment is also applicable to another display device, such as a liquid crystal display device in which the active matrix substrate is used. In addition, the display device thus configured can be used as a flat panel display, and is applicable to various types of electronic devices including a display panel, such as a television set, a personal computer, and a mobile phone.

In this embodiment, a silicon thin film is used as a semiconductor film (a semiconductor layer), but a semiconductor film other than the silicon thin film may be used. For example, a polycrystalline semiconductor film may be formed by crystallizing a semiconductor film comprising germanium (Ge) or SiGe.

The present embodiment has been described referring to the drawings; however, the present invention is not limited to the embodiment. Many modifications are possible in the illustrated embodiment within the same scope as that of the present invention or within the equivalent scope of the present invention.

INDUSTRIAL APPLICABILITY

The present invention can be effectively used for thin-film semiconductor devices such as thin-film transistors, and can be widely used for display devices and the like such as organic EL display devices and liquid crystal display devices.

REFERENCE SIGNS LIST

10 Organic EL display device
11 Active matrix substrate
12 Pixel
13 Organic EL device
14 Anode
15 Organic EL layer
16 Cathode
17 Scanning line
18 Video signal line
21 Driving transistor
22 Switching transistor
21G, 22G, 120, 920 Gate electrode
21S, 22S, 191, 981 Source electrode
21D, 22D, 192, 982 Drain electrode
23 Capacitor
100, 900, 900A, 900B Thin-film semiconductor device
110, 910 Substrate
130, 930 Gate insulating film
140 Channel layer
140M Crystalline silicon thin film
150 First amorphous semiconductor layer
150M First amorphous silicon film
160, 960 Channel protective layer
160M Insulating film
170M Second amorphous silicon film
171, 172 Second amorphous semiconductor layer
180M Contact layer film
181, 182, 971, 972 Contact layer
940 Crystalline silicon layer
950 Non-crystalline silicon layer

The invention claimed is:

1. A thin-film semiconductor device comprising:
a substrate;
a gate electrode above the substrate;
a gate insulating film above the gate electrode;
a channel layer above the gate insulating film, the channel layer comprising a polycrystalline semiconductor;
a first amorphous semiconductor layer above the channel layer;
an organic insulating layer above the first amorphous semiconductor layer;
a pair of second amorphous semiconductor layers, one of which is positioned at a side surface on one side of the first amorphous semiconductor layer and a side surface on one side of the channel layer, and the other of which is positioned at a side surface on the other side of the first amorphous semiconductor layer and a side surface on the other side of the channel layer;
a pair of contact layers above the pair of second amorphous semiconductor layers, the pair of contact layers contacting the side surfaces of the channel layer via the pair of second amorphous semiconductor layers;
a source electrode above one of the pair of contact layers; and a drain electrode above the other of the pair of contact layers,
wherein the gate electrode, the channel layer, the first amorphous semiconductor layer, and the organic insulating layer have outlines that coincide with one another in a top view,
the first amorphous semiconductor layer has a density of localized states higher than a density of localized states of the pair of second amorphous semiconductor layers, and
the pair of second amorphous semiconductor layers has a band gap larger than a band gap of the first amorphous semiconductor layer.

2. The thin-film semiconductor device according to claim 1,
wherein the outline on a lower surface of the organic insulating layer recedes inside the outline of the gate electrode by 0.5 μm at most, in a top view.

3. The thin-film semiconductor device according to claim 2,
wherein the outline on the lower surface of the organic insulating layer recedes inside the outline of the gate electrode by a value greater than or equal to a thickness of the pair of second amorphous semiconductor layers, in a top view.

4. The thin-film semiconductor device according to claim 1,
wherein the pair of second amorphous semiconductor layers, the pair of contact layers, the source electrode, and the drain electrode extend to a part of an upper surface of the organic insulating layer and a side surface of the organic insulating layer.

5. The thin-film semiconductor device according to claim 1,
wherein the first amorphous semiconductor layer has a thickness of 50 nm at most.

6. A method for fabricating a thin-film semiconductor device, the method comprising:
preparing a substrate;
forming a gate electrode above the substrate;
forming a gate insulating film above the gate electrode;
forming a crystalline semiconductor layer above the gate insulating film;
forming an amorphous semiconductor layer above the crystalline semiconductor layer;
forming an organic insulating layer above the amorphous semiconductor layer;
etching the crystalline semiconductor layer and the amorphous semiconductor layer to form a channel layer and a first amorphous semiconductor layer at positions overlapping the gate electrode;

forming a pair of second amorphous semiconductor layers, one of which is formed at a side surface on one side of the first amorphous semiconductor layer and a side surface on one side of the channel layer, and the other of which is formed at a side surface on the other side of the first amorphous semiconductor layer and a side surface on the other side of the channel layer;

forming a pair of contact layers above the pair of second amorphous semiconductor layers, the pair of contact layers contacting the side surfaces of the channel layer via the pair of second amorphous semiconductor layers; and forming a source electrode above one of the pair of contact layers, and forming a drain electrode above the other of the pair of contact layers, wherein in the forming of an organic insulating layer, an outline on a lower surface of the organic insulating layer recedes inside an outline of the gate electrode in a top view by (i) applying an organic material serving as a precursor of the organic insulating layer onto the amorphous semiconductor layer and drying the organic material, (ii) exposing, using the gate electrode as a mask, the organic material to light emitted from a surface of the substrate opposite a surface of the substrate on which the gate electrode is formed, and (iii) developing the organic material.

7. The method for fabricating a thin-film semiconductor device according to claim 6, wherein, in the etching of the crystalline semiconductor layer and the amorphous semiconductor layer, the developed organic insulating layer is used as a mask to allow the outline on the lower surface of the organic insulating layer to recede inside the outline of the gate electrode by a value greater than or equal to a thickness of the pair of second amorphous semiconductor layers, in a top view.

8. The method for fabricating a thin-film semiconductor device according to claim 6, wherein the first amorphous semiconductor layer is formed to have a density of localized states higher than a density of localized states of the pair of second amorphous semiconductor layers, and the pair of second amorphous semiconductor layers are formed to have a band gap larger than a band gap of the first amorphous semiconductor layer.

\* \* \* \* \*